(12) United States Patent
Anayama et al.

(10) Patent No.: US 10,049,949 B2
(45) Date of Patent: Aug. 14, 2018

(54) IN-SITU PACKAGING DECAPSULATION FEATURE FOR ELECTRICAL FAULT LOCALIZATION

(71) Applicant: FEI Company, Hillsboro, OR (US)

(72) Inventors: Tameyasu Anayama, Cupertino, CA (US); John Muzzio, Fremont, CA (US); Herve Deslandes, Sunnyvale, CA (US)

(73) Assignee: FEI Company, Hillsboro, OR (US)

( * ) Notice: Subject to any disclaimer, the term of this patent is extended or adjusted under 35 U.S.C. 154(b) by 112 days.

(21) Appl. No.: 15/331,753

(22) Filed: Oct. 21, 2016

(65) Prior Publication Data

US 2017/0117233 A1    Apr. 27, 2017

Related U.S. Application Data

(60) Provisional application No. 62/245,042, filed on Oct. 22, 2015.

(51) Int. Cl.
*H01L 21/56* (2006.01)
*H01L 21/66* (2006.01)
*G02B 21/00* (2006.01)
*G02B 21/36* (2006.01)

(52) U.S. Cl.
CPC .......... *H01L 22/20* (2013.01); *G02B 21/006* (2013.01); *G02B 21/0016* (2013.01); *G02B 21/365* (2013.01); *H01L 21/56* (2013.01)

(58) Field of Classification Search
CPC ..... H01L 22/20; H01L 21/56; G02B 21/0016; G02B 21/006; G02B 21/365
See application file for complete search history.

(56) References Cited

U.S. PATENT DOCUMENTS

2010/0074515 A1* 3/2010 Zhao ................. G01N 25/72
382/149

* cited by examiner

*Primary Examiner* — Kyoung Lee
(74) *Attorney, Agent, or Firm* — Klarquist Sparkman, LLP

(57) ABSTRACT

An IR camera is used to image an IC to identify hot spots. The objective of the IR camera is removed and laser optics are inserted into the optical axis of the system. A laser is then used to ablate the encapsulation in a defined area around the optical axis. The IR camera operates in a lock-in mode to obtain phase information of the IR signal from the IC. The phase information is used to obtain a depth estimate of the defect. Predetermined etch rates are then used in conjunction with the depth estimate to generate a timed end-point for the laser ablation.

23 Claims, 1 Drawing Sheet

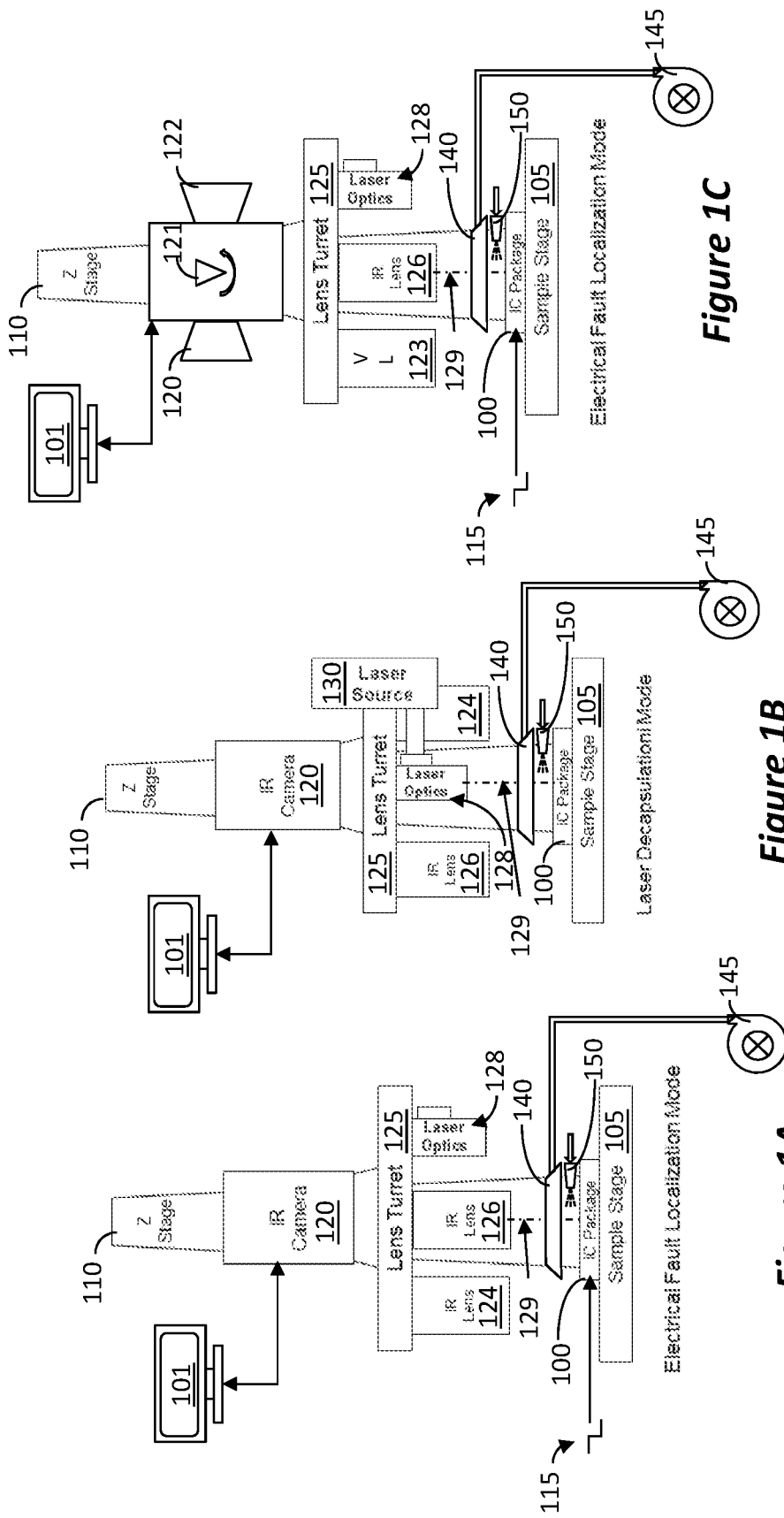

IN-SITU PACKAGING DECAPSULATION FEATURE FOR ELECTRICAL FAULT LOCALIZATION

RELATED APPLICATION

This Application claims priority benefit to U.S. Provisional Application Ser. No. 62/245,042, filed on Oct. 22, 2015.

BACKGROUND

1. Field of Invention

This invention is in the field of IC Diagnostics. More specifically, this invention is about improving time for localization by implementing an in-situ decapsulation.

2. Related Art

Most of the electrical fault localization techniques, such as emission microscope (typically called EMMI), laser scanning microscope, OBIRCH, or TIVA, require surface material to be removed if the analysis is required on a packaged integrated circuit (IC). One exception is lock-in thermography which allows detection of hot spot at the surface of a packaged IC, indicating the x, y, z origin of the electrical defect location. However, also with lock-in thermography technique, sometimes a thick material near the surface of the package tend to make thermal signature to spread out and hence affect the ability to localize with a high spatial resolution.

A stand-alone system to perform laser decapsulation of semiconductor packages has been available and well known in the industry. There are commercial models available such as FALIT by Control Laser Corp., or JET ETCH PRO by Nisene Technology Group, Inc. These systems are capable of removing a large volume of package material but in a dedicated chamber as a single use system.

Laser marking capability also has been available as an integrated option for conventional electrical failure analysis or fault isolation systems. Such an option is used to leave a set of physical marks on a surface of a semiconductor package by etching a pattern of single dot laser marks on the surface. Hamamatsu Photonics offers such option on their PHEMOS-1000 electrical failure analysis system, so does DCG Systems, Inc. on its ELITE lock-in thermography system.

There are other techniques available for removing semiconductor packaging material, such as focused ion beam (FIB), plasma FIB, chemical etching or mechanical polishing. However, all these techniques require either a vacuum environment or tightly controlled environmental chamber for handling the materials being removed.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various disclosed embodiments enable in-situ decapsulation of packaged IC in order to enable further localization of defects.

Disclosed embodiments also provide a system for in-situ decapsulation of packaged IC in order to enable further localization of defects.

An IR camera is used to image an IC to identify hot spots. The objective of the IR camera is removed and laser optics are inserted into the optical axis of the system. A laser is then used to ablate the encapsulation in a defined area around the optical axis. In some embodiments, the phase of the IR camera signal is used to estimate the depth of the defect within the IC. An ablation rate is determined a priory and is used together with the estimated depth to determine a timed ablation period. In some embodiments, the IR camera can then be used to take another image, in which the signal to noise ratio would be improved due to removed encapsulation, and then use the phase information to provide improved depth estimate and optionally perform further timed ablation.

As disclosed herein, an integrated system includes an IR camera and an ablative laser having wavelength tuned to ablate the encapsulation material. The objective optics for both the IR camera and the ablative laser are mounted on a single turret, such that rotation of the turret can place either objective optics over the same point on the sample. A controller operate the system to obtain an IR image of the sample to localize a defect within the sample, including a defect depth estimate. The depth estimate is used to determine the amount of ablation needed. In one example, the depth estimate is converted to ablation time of the laser. In other embodiments, visible light camera and optics are also included, so as to obtain a visible image of the sample.

Disclosed embodiments include a system for testing and decapsulating IC, comprising: a sample stage for supporting the IC; a thermal camera configured to detect location of hot spot caused by potential defect in the IC; a laser source of wavelength 400 nm to 900 nm; a first optics arrangement configured to enable the thermal camera to image the IC, the thermal image being indicative of a location of a hot spot in the IC; a second optical arrangement configured to focus a laser beam from the laser source onto the IC; and a scanner configured to energize the sample stage so as to scan the laser source over a selected area of the IC. The laser source may be a pulsed laser source. An optical turret may be provided, upon which the first and the second optical arrangements are affixed. A controller receives the thermal image from the IR camera and output a depth estimate for the defect. The controller operates on the depth estimate to generate an operational time for the laser ablation and operates the laser according to the operational time. Additionally, a hood is provided and is fluidly connected to a pump and configured to pump sputtered encapsulation material. A nozzle can be configured for injecting a gas jet onto the IC to eject encapsulation material from the decapsulation hole.

The system may further comprise optics stage and wherein the first and second optical arrangements are coupled to the optics stage; the optics stage may comprise a z-stage. The system may further comprise a visible light objective and a visible light camera to image the decapsulation. A selecting optical element can be used to deflect collected light to the thermal camera or the visible light camera. The selecting optical element may comprise a reflex mirror.

Disclosed embodiments also provide a method for identifying defects in an IC, comprising: applying a test signal to the IC; using a first set of optics to collect IR radiation from the IC; using an IR camera to image the IR radiation and generate a thermal image of the IC; using the thermal image to delineate an area of the IC to be decapsulated; and using a second set of optics, focusing a laser beam onto the area delineated and removing encapsulation material from the delineated area only. The method may further comprise using a visible light objective to image the delineated area after removal of the encapsulation material. The test signal may comprise an electrical test signal or a thermal test signal. The method may include rasterizing the laser beam over the delineated area. The method may further comprise generating a second thermal image of the IC after the completion of the removing encapsulation material. Removing the encapsulation material may be performed according to preset length of time. In some embodiments the preset length of time is calculated by: providing a sync signal to the IR camera to correlate IR signals to the test signals; using the IR signals to obtain phase data of the IR signal; using the phase data to estimate depth of the defect within the IC; using the depth estimate to calculate the length of time.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1A illustrates an embodiment for a system for in-situ decapsulation operating in localization mode, while FIG. 1B illustrates an embodiment for a system for in-situ decapsulation operating in decapsulation mode;

FIG. 1C illustrates an embodiment for a system for in-situ decapsulation and including a visible light microscope.

DETAILED DESCRIPTION

Embodiments of the invention use laser based decapsulation or material delayering technique, integrated into electrical fault localization system such as EMMI, OBIRCH, magnetic imaging or lock-in thermography system. Since the thermography technique allows determination of a hot spot quickly through almost any packaging materials, a user can define a small area on the surface of the package to decapsulate and then focus on with a subsequent analysis. Moreover, lock-in thermography is used to estimate the depth of the defect within the sample. In-situ laser decapsulation capability can then remove a certain preset amount of package material from a limited area, typically less than a few hundred micron square and with a depth enough to remove up to 80 or 90% of the surface material or even 100%. The amount to be removed can be estimated using the phase of the IR imaging and converting the depth estimate to laser operation time. The laser decapsulation capability is integrated on the system through a multiple position optical lens turret so that a user can move between optical lenses used for other electrical fault isolation techniques and the laser decapsulation capability without moving the sample, hence always centered at the area of interest.

After a certain amount of surface package material has been removed, a user can either rerun another lock-in thermography analysis which will have a better signal to noise ratio and provide much higher spatial resolution of the thermal spot due to a much smaller package material that will prevent the spreading of the heat before reaching the package surface, or another analysis technique such as OBIRCH, EMMI or magnetic imaging which would not otherwise work without removing the surface package material or the ability to localize would be severely limited.

The surface of the package being removed typically has no patterns that can be used to reference the exact location to be thinned or removed. Therefore, the current methodology to remove package material is to perform this over the entire surface of the package. This process not only can take much longer time than needed but also risk various damaging of the sample as the layout of the chip such as wire bonding inside the package may not be adequately known prior to decapsulating.

Embodiments of this invention provides the capability to decapsulate a very limited area of the surface of the package material immediately after the defect location has been localized without removing or even moving the sample from the center of the optical view. Consequently, in some embodiment the need to mark the area to decapsulate is eliminated. Instead, the optical axis is assumed to designate the center of the area to be decapsulated and a defined radius or area around the optical axis is defined as the area to be decapsulated.

The material to be removed can be metal plate such as aluminum or copper, or other packaging materials such as mold compound, or silicon material. The area of the opening can vary from less than 10 micron square to 1 mm square with a depth ranging between a few microns to over 500 microns. The end pointing of the depth control can be set accurately by known etching rate over a preset etching time. For example, a look-p table ban be generated beforehand, which provide for each material the etch or ablation rate of the laser. Then, by using a depth estimate of the defect, the look-up table can be used to determine the amount of time to operate the laser.

Advantages of the disclosed embodiments include preventing damaging parts inside the IC and significantly reducing the overall time to obtain the most accurate and high resolution defect localization. The time saving can be few hours to over half a day per sample depending on the conditions. Additionally, since only part of the encapsulation is removed, the thermal conduction function of the encapsulation is not reduced, so that the IC can be energized for the testing. Moreover, the endpoint of the decapsulation can be accurately calculated using the lock-in thermography depth estimate.

The laser source may be a single-shot, continuous (1 Hz) or Burst (e.g., 10 sec at 5 Hz) laser. The cut size may be up to 50 um by 50 um using, e.g., a 50× objective. If a larger area needs to be decapsulated, a rasterizing process can be used by either moving the sample stage, deflecting the laser beam, or both. The depth of removal may depend on the type of material, the power setting of the laser source, the repetition rate, the aspect ratio (e.g., 3:1 aperture diameter vs depth, e.g., a 50 um diameter may be to a depth of 15-20 um.), etc.

According to disclosed embodiments, means are provided to avoid contamination of the sample, the lenses and the manipulators. A vacuum exhaust system is provided to remove decapsulated material. In other embodiments, gas injection is provided to assist in removing material from within the decapsulation area.

FIGS. 1A and 1B illustrate an embodiment of the integrated system. FIG. 1A illustrates an embodiment for a system for in-situ decapsulation operating in localization mode, while FIG. 1B illustrates it operating in decapsulation mode. The system operates under the control of a controller

101, e.g., an appropriately programmed PC. In FIGS. 1A and 1B the sample IC 100 is positioned on a sample stage 105. The optics stage 110 includes a z-stage to help in focusing the various objectives onto the IC 100. In the operational mode shown in FIG. 1A, test signal 115 may be applied to the IC. In response to test signal 115, faulty circuit elements within IC 100 will heat up. The heat will spread to the surface of the encapsulation of IC 100. During this time, the IC is imaged using IR camera 120 through one of objective lenses 124 or 126. The image from camera 120 can be used to determine the approximate spatial location of the defect. In some embodiments, a sync signal is provided to temporally correlate the IR imaging with the test signals, thereby perform lock-in thermography and enable estimation of the depth of the defect.

While in the embodiment of FIG. 1A an electrical test signal is applied, in other embodiments different test signals may be applied. For example, the test signal may be a thermal signal applied to the sample, and the IR image indicates the propagation of the thermal signal through the sample. In other embodiments, an illumination beam, e.g., a laser beam, may be used to excite certain locations on the sample and the IR image can be used to study the propagation of the excitation, e.g., thermal excitation, through the sample. In either case, the timing of the heating can be temporally correlated to the IR imaging to obtain defect depth estimate.

The objectives 124 and 126, together with laser optics 128 are attached to lens turet 125. Turet 125 is rotatable to place different objectives in the optical axis 129 of the system. When a hot spot has been identified in the IR image, the sample stage 105 can be activated to place the center of the hot spot aligned with the optical axis 129. The test signal 115 can be stopped, and the system can assume the decapsulation mode of operation, as exemplified by FIG. 1B. Specifically, the turet is turned so as to place the laser optics 128 at the optical axis position. Then laser source 130 is energized to abelate the encapsulation material that is aligned with the optical axis. Specifically, the sample stage 105 can be energized by the controller 101 to generate a scanning of the laser beam over a selected area of the sample. In most cases moving the stage would provide a sufficiently accurate scan control. If a better accuracy is needed, then the laser beam may also be scanned using, e.g., a beam tilting mechanism (e.g., acousto-optical deflector—AOD, tilting mirrors, etc.) to abelate an area specified beforehand. For example, a 50 micron diameter may be specified, and the scanning mechanism operated to scan the laser beam to abelate an area of diameter 50 micron around the optical axis by either moving the stage, moving the laser beam, or both. Of course, if preferred, the scanning mechanism can also be used to abelate a square or rectangular area having its center at the optical axis. This ensures that the abelated area has its center where the defect is predicted to be.

When the IR imaging is temporally correlated to a test signal, i.e., operating in a lock-in mode, the following process can be followed. First, various encapsulation and die materials are etch or ablated using the laser, and the etch or ablation rate is recorded. For example, a look-up tale can be stored in the controller 101, correlating etch rate for each material. Then, during testing operation, the lock-in thermography uses the phase of the IR imaging signal to generate an estimate depth of the defect within the sample. Using the depth estimate, the information regarding the encapsulation material, and the recorded etch rate for that encapsulation material, the total etch time is calculated to provide a timed end-point for the laser. The laser is then operated according to the calculated etch time and the etching is stopped when the timed end-point is reached.

Also shown in FIGS. 1A and 1B is an optional hood 140 and pump 145, used to evacuate sputtered material. The pump is activated during the decapsulation mode to remove any encapsulation material that is being abelated by the laser beam. Additionally, an optional nozzle 150 provides a flow of gas, e.g., air or argon, that removes the sputtered material from within the hole being dug by the laser beam. As the material is being removed from the hole by the gas flow, it is being sucked into the hood 140 and removed from the working area of the system.

FIG. 1C illustrates an embodiment for a system for in-situ decapsulation that includes a visible light microscope. Specifically, in this embodiment a selecting optical element 121 is used to deflect the collected light towards IR camera 120 or visible light camera 122. The selecting optical element 121 may be, e.g., a tilting mirror such as a reflex mirror used in a single lens reflex (SLR) camera. Also, turret 125 includes a visible light objective 123. In this embodiment, a preset time is selected for the ablation operation of the laser 128. Once the laser completes the timed ablation, the laser optics is removed from the optical axis and the visible light objective is inserted into the optical axis. An image is then taken of the ablated area to check whether sufficient material has been removed. If not, the laser may be used to further ablate the encapsulation. Alternatively, or in addition, the IR optics may be inserted and another IR image may be obtained to obtain a better localization of the defect. Notably, since less material is now above the defect, the signal to noise ratio of the IR imaging would be much better, leading to better defect localization.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A system for testing and decapsulating IC, comprising:
    a sample stage for supporting the IC;
    a thermal camera configured to detect location of hot spot caused by potential defect in the IC;
    a laser source of wavelength 400 nm to 900 nm;
    a first optics arrangement configured to enable the thermal camera to image the IC, the image being indicative of a location of a hot spot in the IC;
    a second optical arrangement configured to focus a laser beam from the laser source onto the IC;
    a scanner configured to generate a scanning motion between the laser beam and the IC so as to ablate a selected area of the IC.

2. The system of claim 1, wherein the laser source is a pulsed laser source.

3. The system of claim 1, further comprising an optical turret upon which the first and the second optical arrangements are affixed.

4. The system of claim 1, further comprising a hood fluidly connected to a pump and configured to pump sputtered encapsulation material.

5. The system of claim 1, further comprising a nozzle configured for injecting a gas jet onto the IC.

6. The system of claim 1, further comprising optics stage and wherein the first and second optical arrangements are coupled to the optics stage.

7. The system of claim 6, wherein the optics stage comprises a z-stage.

8. The system of claim 1, further comprising a visible light objective and a visible light camera.

9. The system of claim 8, further comprising a selecting optical element to deflect collected light to the thermal camera or the visible light camera.

10. The system of claim 9, wherein the selecting optical element comprises a reflex mirror.

11. The system of claim 1, further comprising a controller receiving signals from the IR camera and programmed to provide depth estimate of the defect using the signals from the IR camera.

12. The system of claim 11, wherein the controller is further programmed to generate a timed end-point for the laser using the depth estimate.

13. The system of claim 12, further comprising a look-up table stored in the controller, the look-up table correlating etch rate for various materials.

14. A method for identifying defects in an IC, comprising:
placing an IC on a sample stage;
applying a test signal to the IC;
using a first set of optics to collect IR radiation from the IC;
using an IR camera to image the IR radiation and generate a thermal image of the IC;
using the thermal image to delineate an area of the IC to be decapsulated;
while the IC remains on the sample stage, using a second set of optics to focus a laser beam onto the area delineated and removing encapsulation material from the delineated area only.

15. The method of claim 14, further comprising using a visible light objective to image the delineated area after removal of the encapsulation material.

16. The method of claim 14, wherein the test signal comprises an electrical test signal.

17. The method of claim 14, wherein the test signal comprises a thermal test signal.

18. The method of claim 14, further comprising activating the sample stage so as to spatially move the sample, thereby scanning the laser beam over the delineated area.

19. The method of claim 14, wherein the test signal comprises an illumination beam.

20. The method of claim 14, further comprising generate a second thermal image of the IC after the completion of the removing encapsulation material.

21. The method of claim 14, wherein removing encapsulation material is performed according to preset length of time.

22. The method of claim 21, wherein the preset length of time is calculated by the steps:
determining etch rates of the laser for different materials;
using the IR radiation to generate depth estimate of the defect;
using the depth estimate and a selected etch rate to generate the preset length of time.

23. The method of claim 22, wherein using the IR radiation to generate depth estimate comprises using a lock-in imaging to determine a phase of the IR signal and correlating the phase to heat propagation rate within the IC material to thereby generate the depth estimate.

* * * * *